United States Patent
Mani et al.

(10) Patent No.: US 8,400,866 B2
(45) Date of Patent: Mar. 19, 2013

(54) VOLTAGE BOOSTING IN MRAM CURRENT DRIVERS

(75) Inventors: Krishnakumar Mani, San Jose, CA (US); Anil Gupta, Saratoga, CA (US)

(73) Assignee: Magsil Corporation, Santa Clara, CA (US)

( * ) Notice: Subject to any disclaimer, the term of this patent is extended or adjusted under 35 U.S.C. 154(b) by 198 days.

(21) Appl. No.: 12/852,335

(22) Filed: Aug. 6, 2010

(65) Prior Publication Data

US 2011/0032755 A1     Feb. 10, 2011

Related U.S. Application Data

(60) Provisional application No. 61/231,681, filed on Aug. 6, 2009.

(51) Int. Cl.
*G11C 8/00*     (2006.01)

(52) U.S. Cl. .................................. 365/230.06; 365/171

(58) Field of Classification Search ............... 365/171 X, 365/230.06 O, 171, 230.06
See application file for complete search history.

(56) References Cited

U.S. PATENT DOCUMENTS

| | | | |
|---|---|---|---|
| 6,215,349 B1 * | 4/2001 | Hanson et al. | 327/390 |
| 7,564,736 B2 * | 7/2009 | Kobayashi | 365/230.06 |
| 7,961,548 B2 * | 6/2011 | Lee | 365/230.06 |

* cited by examiner

*Primary Examiner* — VanThu Nguyen
(74) *Attorney, Agent, or Firm* — Hahn and Moodley LLP; Vani Moodley, Esq.

(57) ABSTRACT

A current driving mechanism for a magnetic memory device, comprising: a) a current driver circuit; and b) a current decoding block coupled to the current driver circuit, wherein the current decoding block comprises a transistor (M18) to control driver currents from the current driver circuit, and wherein the transistor (M18) has a smaller form factor then otherwise possible by virtue of maintaining a gate thereof at a negative voltage.

20 Claims, 7 Drawing Sheets

US 8,400,866 B2

VOLTAGE BOOSTING IN MRAM CURRENT DRIVERS

This invention claims the benefit of priority to provisional patent application U.S. 61/231,681 filed Aug. 6, 2009.

TECHNICAL FIELD OF THE DISCLOSURE

Embodiments of the present invention relate to magnetic random access memory (MRAM).

BACKGROUND OF THE DISCLOSURE

In MRAM memory devices, current drivers are used to pass pre-determined current levels to selected rows and columns. As shown in FIG. 1, a typical implementation may include a pair of word line current drivers. Specifically, a word line current driver 11 of the pair of current drivers is shown on left and another word line current driver 12 of the pair of current drivers is shown on right of the FIG. 1. One pair of such word line current drivers is used for each word line as shown in FIG. 1. Further, a bit line current driver 13 is used on top and another bit line current driver 14 is used at bottom, as shown in FIG. 1. Specifically, a pair of such bit line current drivers is used for each bit line as shown in FIG. 1.

Various circuits may be designed to realize the aforementioned currents drivers 11-14. By way of example, FIG. 2, a transistor circuit 21 is used to realize the current drivers 11-14. In operation, for logic level '1', an "Enable" signal is activated to turn off transistors M1 and M5. Further, when a reference current source 'Iref' is generated, transistor M4 is turned on and current is mirrored from transistor M2 to transistor M3. In one embodiment, when Iref=100 uA and a size ratio of $(W/L)_{M3}/(W/L)_{M2}=10$, then M3 can supply current of 1 mA (100 uA×10=1 mA). In the same way, M3 can supply current of 10 mA, when M3 to M2 size ratio is 100 and Iref=100 uA. The concept of current mirroring, where M3 can provide current equal to Iref multiplied by size ratio of M3 and M2, is known in the art. Keeping Iref constant, the need for M3 to deliver large currents during write operations in a MRAM memory requires the M3 size to be large. However, M3 has to be drawn in a layout to fit in relatively small pitch of a memory bit cell, and a large M3 size adversely affects total die size.

In an MRAM array, since only one row or column in each memory block needs to pass current at a given time, only one main current driver 21 (as shown in FIG. 2) is required for each memory block. In a typical design, four current drivers would be sufficient for each block of a MRAM cell: one for the left word line block, one for the right word line block, one for the top bit line block, and one for the bottom bit line block. A current from one such current driver 31 in FIG. 3 can be diverted to a desired row or column by appropriate current decoding block 32. Lines G30 to G3n are decoded from address and/or data-input signals. Only one of the selected lines from G30 to G3n will be high. For G30 as a selected line, G30 will be high and corresponding node 33 will be low. Low level (0 volts) at the gate of P-channel transistor M10 provides current from main current source 31 to the selected row/column line RC30.

But while FIG. 3 is a significant improvement over the previous design of FIG. 2 in reducing the number of current drivers 21, the size of transistors such as M10 has to be large so as to be able to pass large currents during MRAM write operations. There are multiple such M10 transistors, one for each row/column, therefore a large of M10 size would adversely affect die size and cost.

SUMMARY OF THE DISCLOSURE

In one aspect, the present disclosure provides a current driving mechanism for a magnetic memory device, comprising: a) a current driver circuit; and b) a current decoding block coupled to the current driver circuit, wherein the current decoding block comprises a transistor M18 to control driver currents from the current driver circuit, and wherein the transistor M18 has a smaller form factor then otherwise possible by virtue of maintaining a gate thereof at a negative voltage.

In another aspect, the present disclosure provides a magnetic random access memory (MRAM) chip comprising: a) an array of memory cells; and b) a current driving mechanism coupled to the array of memory cells, the current driving mechanism comprising 1) a current driver circuit; and 2) a current decoding block coupled to the current driver circuit, wherein the current decoding block comprises a transistor M18 to control driver currents from the current driver circuit, and wherein the transistor M18 has a smaller form factor then otherwise possible by virtue of maintaining a gate thereof at a negative voltage.

In yet another aspect, the present disclosure provides a magnetic random access memory (MRAM) device comprising: a MRAM chip having an array of memory cells and a current driving mechanism coupled to the array of memory cells, the current driving mechanism comprising a) a current driver circuit; and b) a current decoding block coupled to the current driver circuit, wherein the current decoding block comprises a transistor M18 to control driver currents from the current driver circuit, and wherein the transistor M18 has a smaller form factor then otherwise possible by virtue of maintaining a gate thereof at a negative voltage.

In yet another aspect, the present disclosure provides a current driving mechanism for a magnetic memory device, comprising: a) a current driver circuit; and b) a current decoding block coupled to the current driver circuit, wherein the current decoding block comprises 1) a transistor M30 to control driver currents from the current driver circuit; and 2) a high voltage switch coupled to the transistor M30 to boost a voltage of a selected gate of the transistor M30 to a higher level, and wherein the transistor M30 is has a smaller form factor then otherwise possible by virtue of said boosting; and 3) a charge pump circuit to disposed between the current driver circuit and the current decoding block to drive the high voltage switch.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

Figure 1:
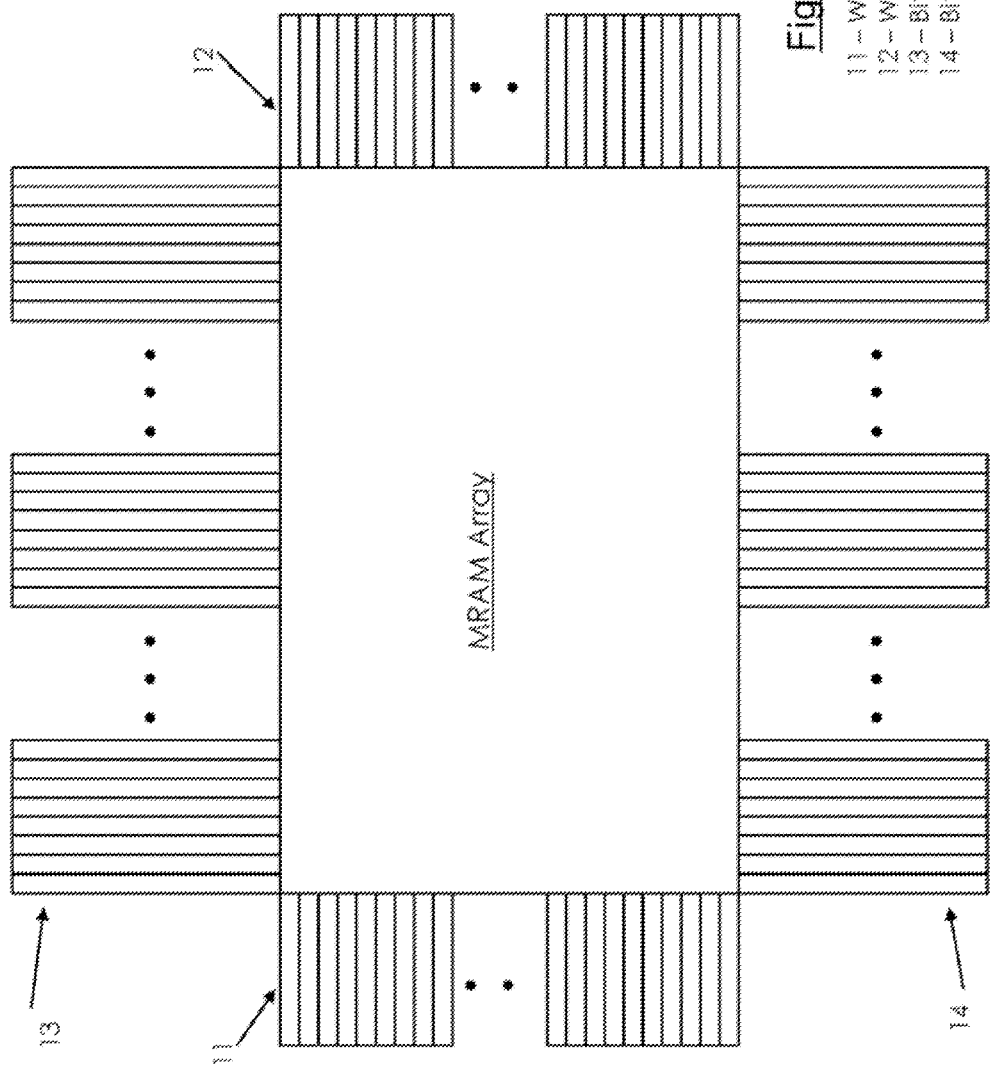
FIG. 1 shows a MRAM Memory array layout with word line current drivers and bit line current drivers.
Figure 2:
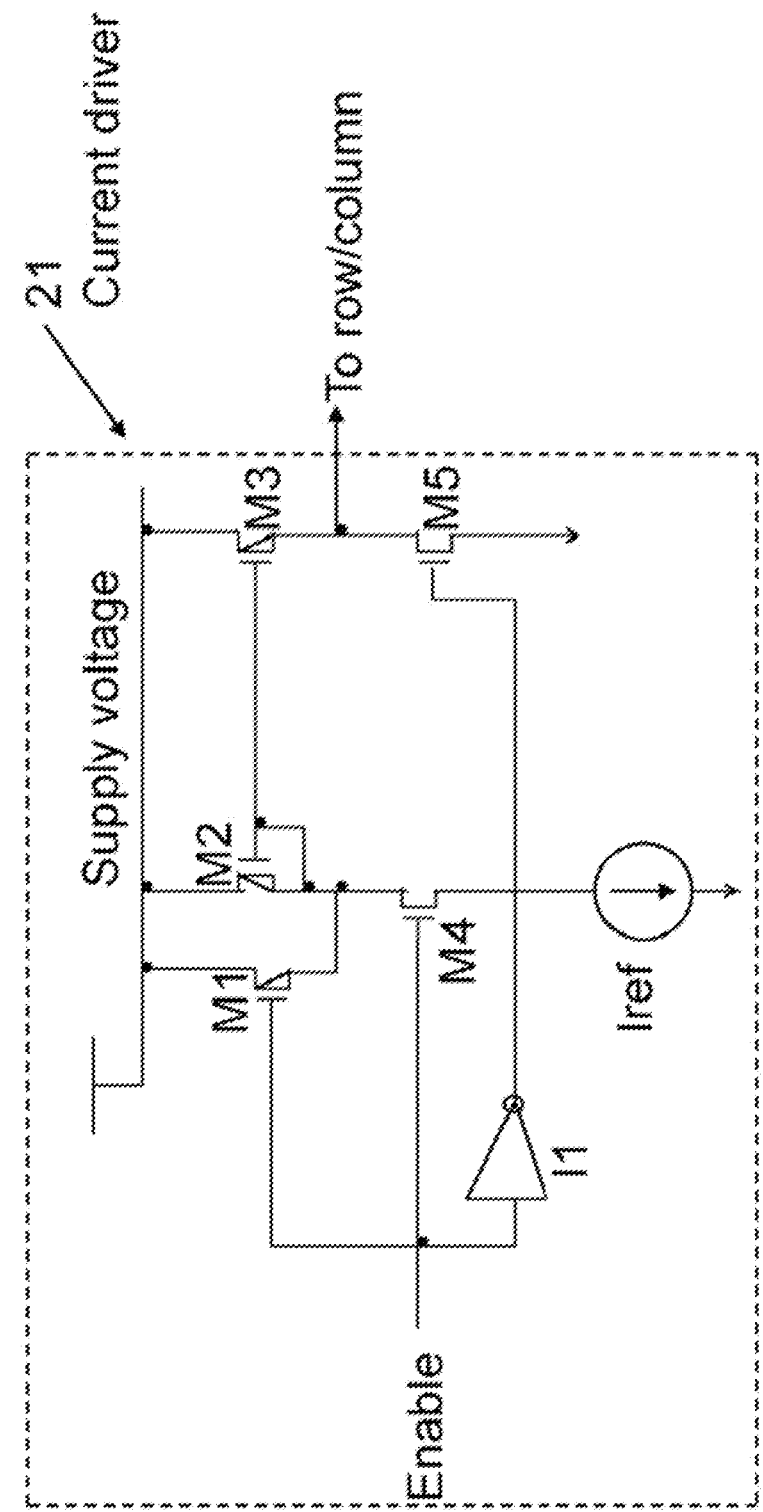
FIG. 2 shows current drivers of FIG. 1 in transistor form.

The method and system have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

In the following description, for purposes of explanation, numerous specific details are set forth in order to provide a thorough understanding of the disclosure. It will be apparent, however, to one skilled in the art, that the disclosure may be practiced without these specific details. In other instances, structures and devices are shown at block diagram form only in order to avoid obscuring the disclosure.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the present disclosure explain various techniques that may be used to reduce size of transistors in current driver circuits in a MRAM cell.

Figure 3:
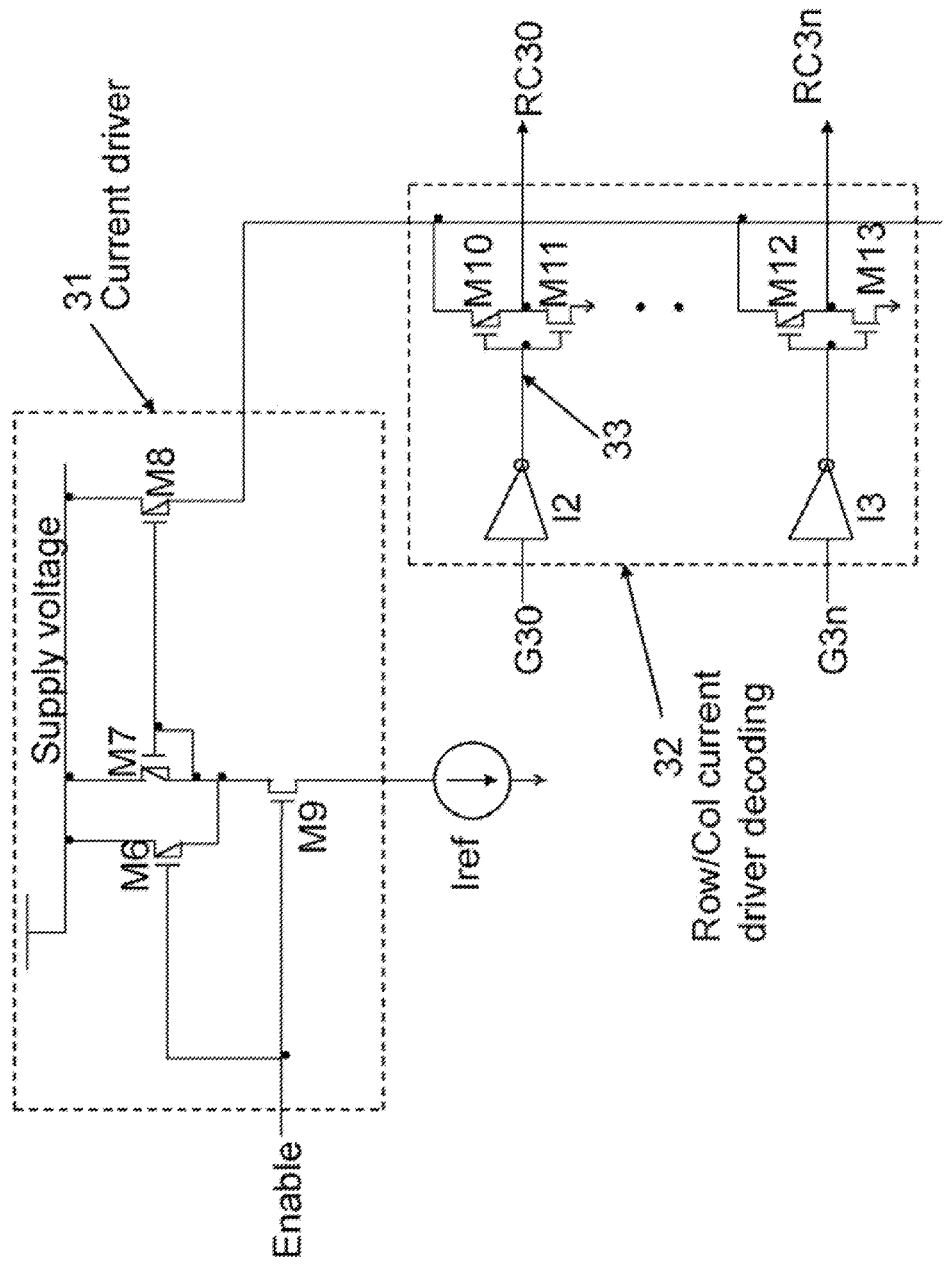
FIG. 3 shows a current driver circuit coupled to a current decoding block.
Figure 4:
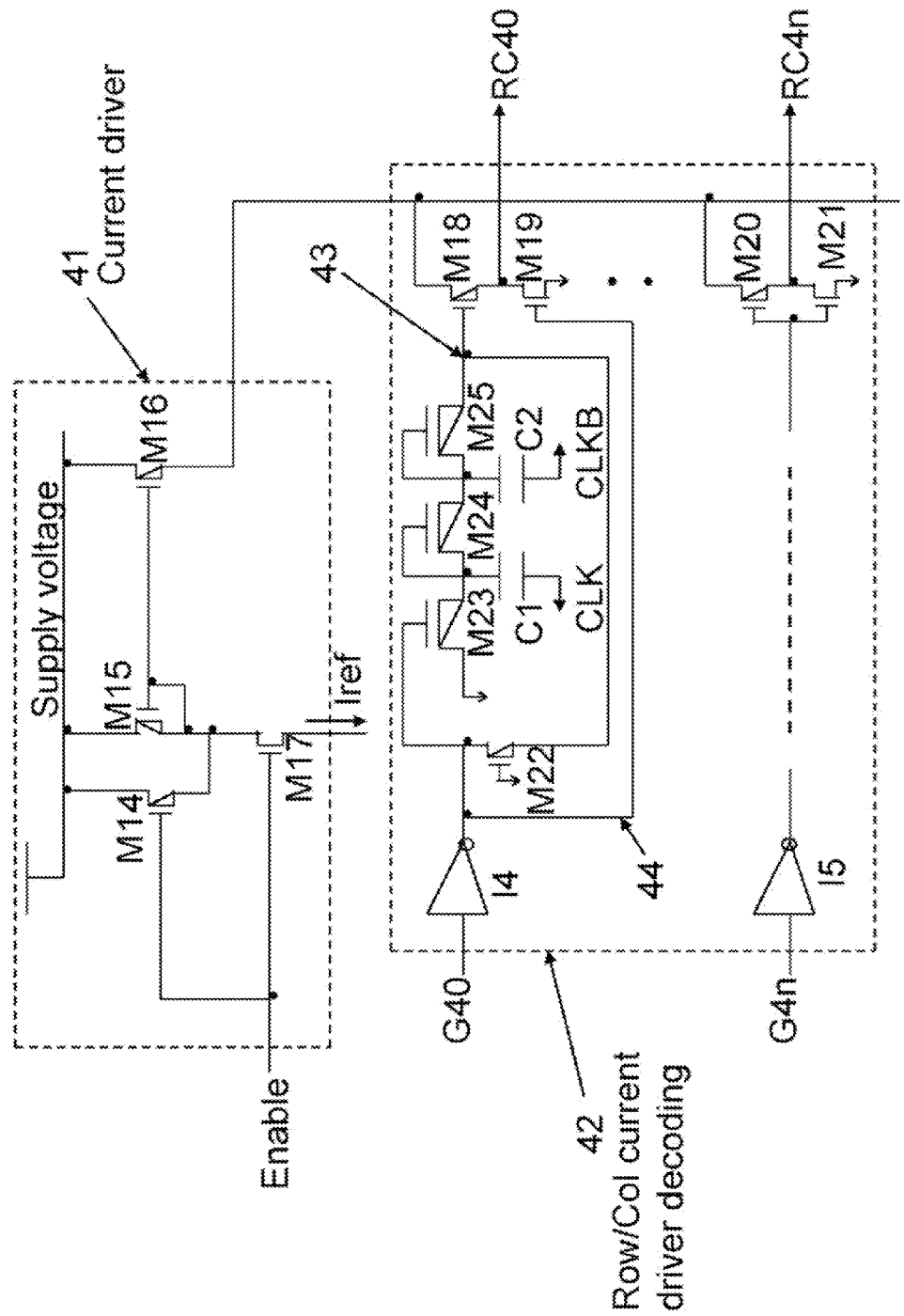
FIG. 4 shows the current driver coupled to a current decoding block having a P-channel transistor, in accordance with an embodiment of the present disclosure.

FIG. 4 shows a current driving mechanism, in accordance with one embodiment of the invention. The mechanism comprises transistor M18 to control driver currents from driver circuit 41 to current decoding block 42. Advantageously, a gate of the transistor M18 can be taken to a voltage level below 0 volts for a selected line. This allows the size of the transistor M18 to be significantly reduced with respect to transistor M10. Transistor 22 isolates negative voltage from appearing on inverter I4, whereas logical voltage level of "1" can freely pass from I4 through transistor M22 to node 43 for the unselected case. Logic "1" level on node 43 turns off P-channel transistor M18 and does not allow passing of current from main driver to rows/columns. For the selected case, node 43 is driven to logic "0" by inverter I4. The combination of M23 as a switch, M24 and M25 connected as a diode, and capacitors C1 and C2 pumps the node 43 below 0 volts thereby pumping a gate of M18 to a level below 0 volts, such as −3 volts. This turns on M18 more strongly, thereby allowing for a smaller size of M18 in FIG. 4 compared to M10 in FIG. 3, for same current carrying capability. Reduced size of M18 leads to smaller die size and less cost.

Figure 5:
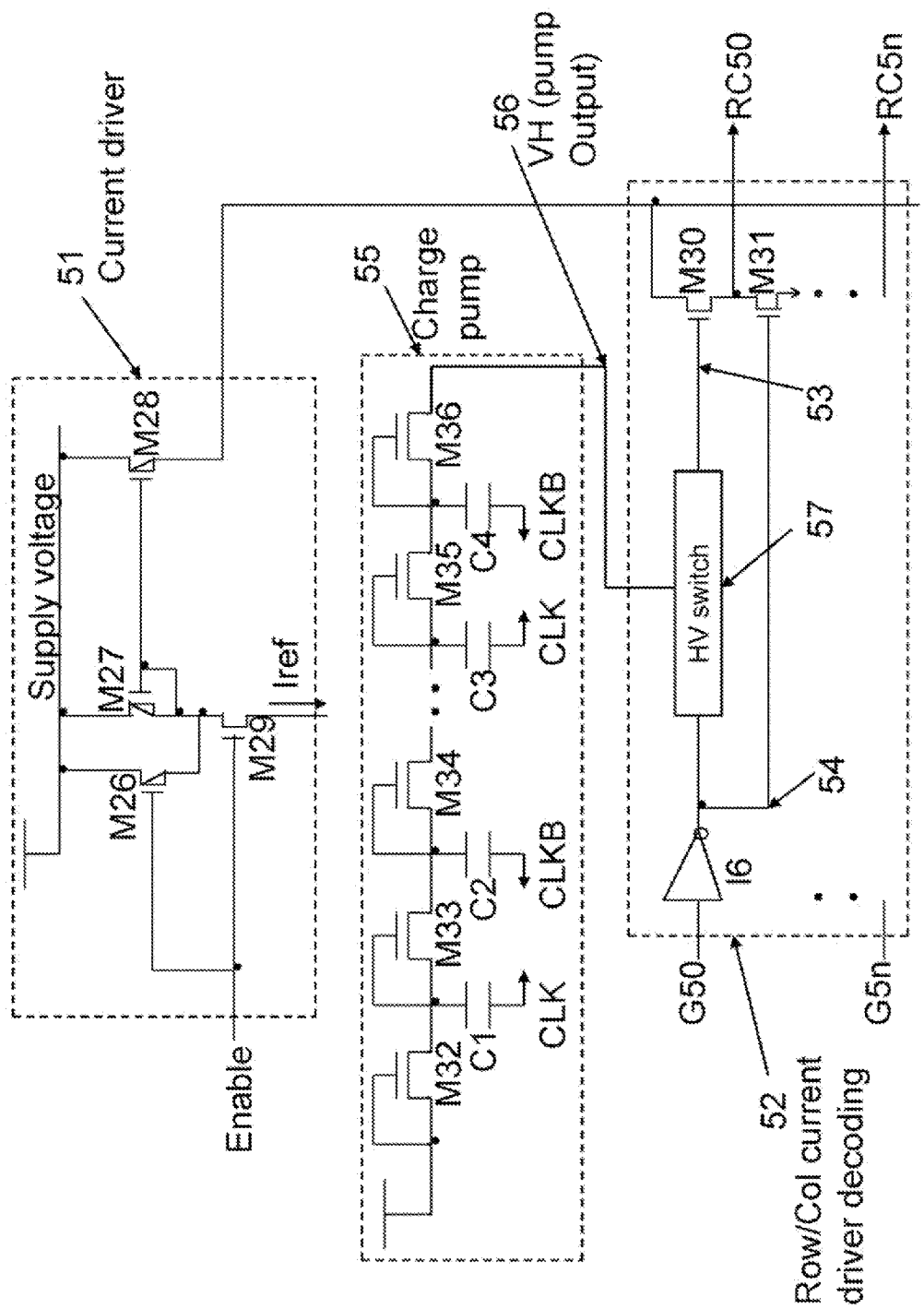
FIG. 5 shows the current driver coupled to a current decoding block having a N-channel transistor, in accordance with an embodiment of the present disclosure.

Another embodiment of present disclosure is shown in FIG. 5. Current from current driver 51 is routed to selected row/column line by N-channel transistor M30 of a current decoding block 52. A gate of selected transistor M30 is boosted to a higher positive level, typically above 5 volts. The associated line 54 for selected row/column line is held at 0 volts. The high voltage switch block 57 can be implemented by using design techniques, which has low voltage input and provide inverted high voltage output of VH level. Higher positive voltage on line 53 allows reduction in size of M30 and hence provides reduced die size. An illustration is given in FIG. 5 of a charge pump (or, voltage multiplier) circuit to raise the voltage VH (at pump output 56) to a level well above supply voltage, typically above 5 volts from a 1.8V or 3V supply. Voltage level VH depends on number of stages in charge pump 55, and size of transistor M30 is inversely proportional to pumped voltage level VH.

While some examples have been provided for applying boosted positive and negative voltages on gates of transistors, there can be numeral variations of voltage doublers, voltage boosters, and charge pumps to accomplish the same. It will be obvious to those knowledgeable in the art, that such variations are merely different implementations of same invention.

Figure 6:
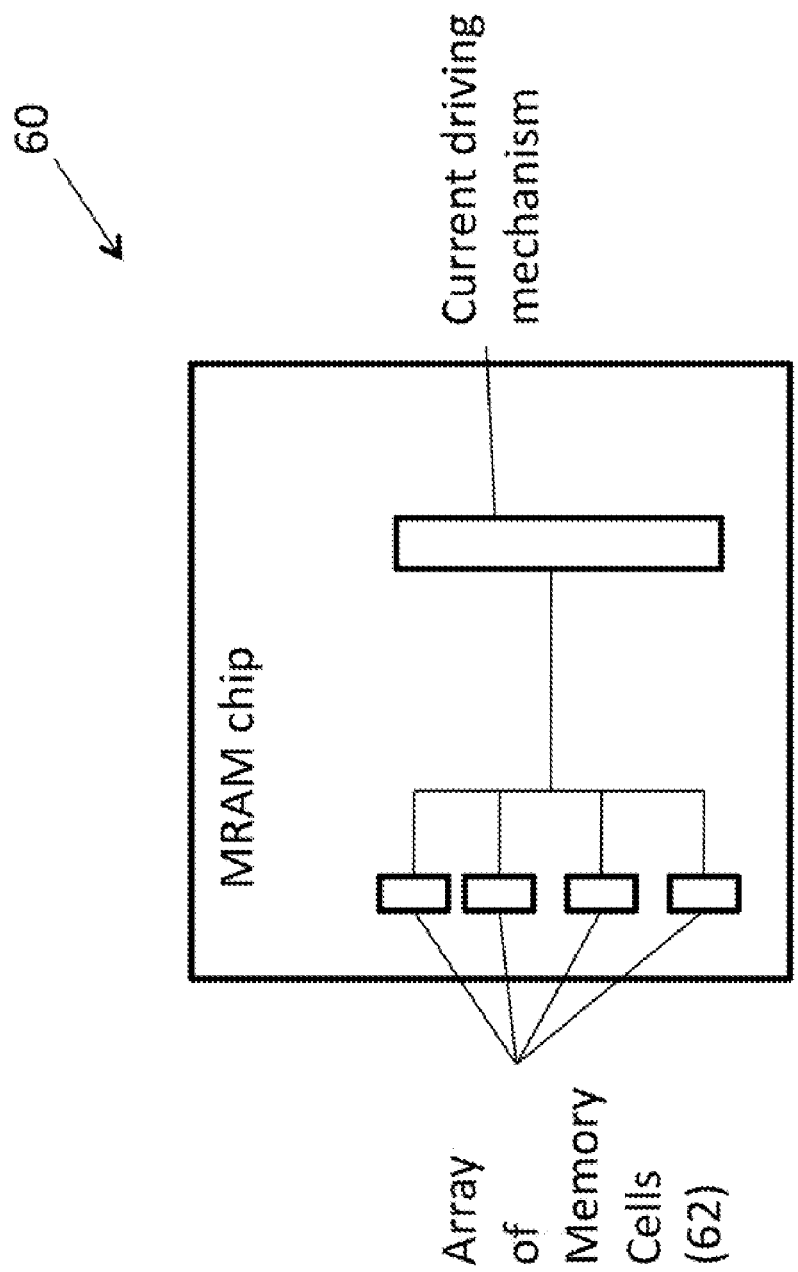
FIG. 6 is a schematic drawing of an MRAM chip, having a current driving mechanism in accordance with one embodiment of the invention.

Referring now to FIG. 6, a MRAM chip 60 having a current driving mechanism is shown. The MRAM chip may have an array of memory cells. The current driving mechanism may be coupled to the array of memory cells. In the present embodiment, the current driving mechanism may comprise a current driver circuit and a current decoding block coupled to the current driver circuit.

Figure 7:
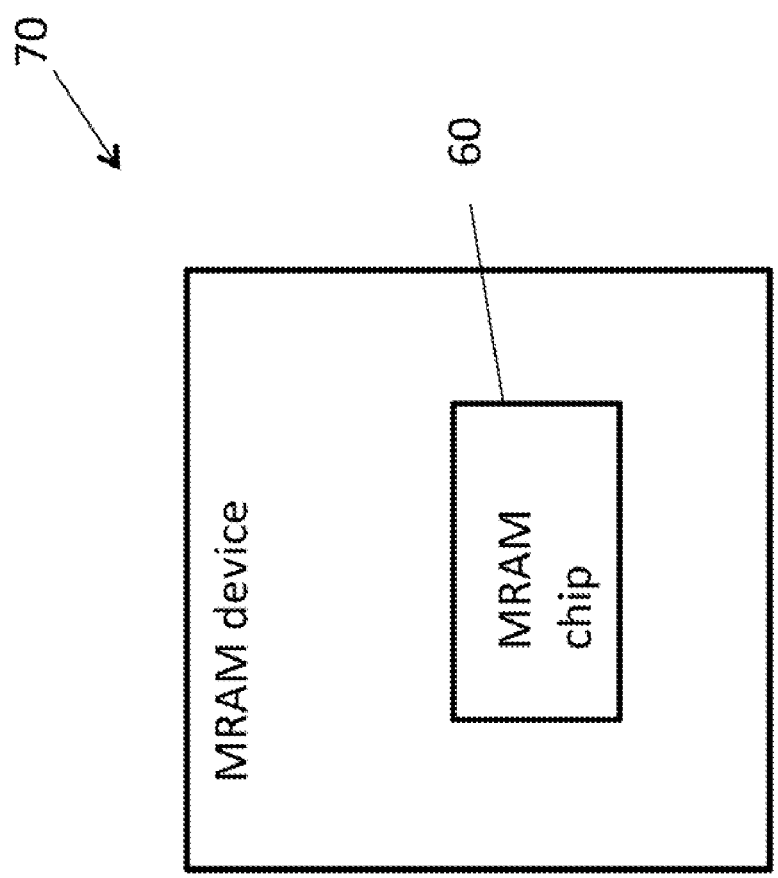
FIG. 7 is a schematic drawing for an MRAM device incorporating an MRAM chip in accordance with one embodiment of the invention.

Referring now to FIG. 7, an MRAM device 70 having an MRAM chip 60 is shown. In one embodiment, the MRAM device 70 is a display device. However, in another embodiment the MRAM device 70 may be any other device having an MRAM chip 60.

We claim:

1. A current driving mechanism for a magnetic memory device, comprising:
   a current driver circuit: and
   a current decoding block coupled to the current driver circuit, wherein the current decoding block comprises
      a transistor (M18) to control driver currents from the current driver circuit, and
      a transistor (M22) and an inverter (I4), wherein the transistor (M22) isolates a negative voltage from the inverter (I4), and wherein the transistor (M22) facilitates maintenance of the negative voltage at a gate of the transistor (M18), thereby allowing a reduced form factor for the transistor (M18) by virtue of maintaining the gate thereof at the negative voltage.

2. The current driving mechanism of claim 1, wherein a voltage high signal passes freely from the inverter (I4) through the transistor (M22) to a node (43) of the current decoding block when a row/column is unselected.

3. The current driving mechanism of claim 2, wherein a logic high on the node (43) turns off the transistor (M18) to prevent current passing from the current driver circuit to rows/columns.

4. The current driving mechanism of claim 3, wherein the current decoding block comprises an arrangement of components to hold the node (43) at a voltage below zero to drive the gate of the transistor (M18) to below zero.

5. The current driving mechanism of claim 1, wherein the gate of the transistor (M18) is kept at −3V.

6. A magnetic random access memory (MRAM) chip comprising:
   an array of memory cells; and
   a current driving mechanism coupled to the array of memory cells, the current driving mechanism comprising
      a current driver circuit; and a current decoding block coupled to the current driver circuit, wherein the current decoding block comprises
  a transistor (M18) to control driver currents from the current driver circuit, and
  a transistor (M22) and an inverter (I4), wherein the transistor (M22) isolates a negative voltage from the inverter (I4), and wherein the transistor facilitates maintenance of the negative voltage at a gate of the transistor (M18), thereby allowing a reduced form factor for the transistor (M18) by virtue of maintaining the gate thereof at the negative voltage.

7. The MRAM chip of claim 6, wherein a voltage high signal passes freely from the inverter (I4) through the transistor (M22) to a node (43) of the current decoding block when a row/column is unselected.

8. The MRAM chip of claim 7, wherein a logic high on the node (43) turns off the transistor (M18) to prevent current passing from the current driver circuit to rows/columns.

9. The MRAM chip of claim 8, wherein the current decoding block comprises an arrangement of components to hold the node (43) at a voltage below zero to drive the gate of the transistor (M18) to below zero.

10. The MRAM chip of claim 6, wherein the gate of the transistor (M18) is kept at ~3V.

11. A magnetic random access memory (MRAM) device comprising:
  a MRAM chip having an array of memory cells and a current driving mechanism coupled to the array of memory cells, the current driving mechanism comprising
    a current driver circuit; and
    a current decoding block coupled to the current driver circuit, wherein the current decoding block comprises
      a transistor (M18) to control driver currents from the current driver circuit, and
      a transistor (M22) and an inverter (I4), wherein the transistor (M22) isolates a negative voltage from the inverter (I4), and wherein the transistor (M22) facilitates maintenance of the negative voltage at a gate of the transistor (M18), thereby allowing a reduced form factor for the transistor (M18) by virtue of maintaining the gate thereof at the negative voltage.

12. The MRAM device of claim 11, wherein a voltage high signal passes freely from the inverter (I4) through the transistor (M22) to a node (43) of the current decoding block when a row/column is unselected.

13. The MRAM device of claim 12, wherein a logic high on the node (43) turns off the transistor (M18) to prevent current passing from the current driver circuit to rows/columns.

14. The MRAM device of claim 13, wherein the current decoding block comprises an arrangement of components to hold the node (43) at a voltage below zero to drive the gate of the transistor (M18) to below zero.

15. A current driving mechanism for a magnetic memory device, comprising:
  a current driver circuit; and
  a current decoding block coupled to the current driver circuit, wherein the current decoding block comprises
    a transistor (M30) to control driver currents from the current driver circuit; and
    a high voltage switch coupled to the transistor (M30) to boost a voltage of a selected gate of the transistor (M30) to a higher level, thereby allowing a reduced form factor for the transistor (M30) by virtue of said boosting; and
    a charge pump circuit to disposed between the current driver circuit and the current decoding block to drive the high voltage switch.

16. The current driving mechanism of claim 15, wherein an associated line for selected rows and columns of the current decoding block is held at 0 volts.

17. The current driving mechanism of claim 15, where the gate of the transistor (M30) is held at 5V.

18. The current driving arrangement of claim 1, wherein the arrangement of components includes a combination of (M23) as a switch, (M24) and (M25) connected as diodes, and (C1) and (C2) connected as capacitors.

19. The MRAM chip of claim 6, wherein the arrangement of components includes a combination of (M23) as a switch, (M24) and (M25) connected as diodes, (C1) and (C2) connected as capacitors.

20. The MRAM device of claim 11, wherein the arrangement of components includes a combination of (M23) as a switch, (M24) and (M25) connected as diodes, (C1) and (C2) connected as capacitors.

* * * * *